United States Patent
Ito (10) Patent No.: US 7,764,538 B2
(45) Date of Patent: Jul. 27, 2010

(54) MAGNETIC MEMORY AND METHOD FOR WRITING TO MAGNETIC MEMORY

(75) Inventor: Kenchi Ito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 24 days.

(21) Appl. No.: 12/314,577

(22) Filed: Dec. 12, 2008

(65) Prior Publication Data
US 2009/0168501 A1 Jul. 2, 2009

(30) Foreign Application Priority Data
Dec. 26, 2007 (JP) ............................. 2007-333872

(51) Int. Cl.
*G11C 11/00* (2006.01)
(52) U.S. Cl. .................... 365/158; 365/171; 365/173
(58) Field of Classification Search .............. 365/158, 365/171, 173
See application file for complete search history.

(56) References Cited

U.S. PATENT DOCUMENTS

| 5,734,605 | A | 3/1998 | Zhu et al. | |
|---|---|---|---|---|
| 2007/0253118 | A1* | 11/2007 | Hayakawa et al. | 360/324.2 |
| 2008/0164547 | A1* | 7/2008 | Higo et al. | 257/421 |
| 2008/0204946 | A1* | 8/2008 | Ochiai et al. | 360/324.12 |

OTHER PUBLICATIONS

J.C. Slonczewski, "Current-Driven Excitation of Magnetic Multilayers", Journal of Magnetism and Magnetic Materials, 159 (1996), pp. L1-L7.

J.A. Katine et al., "Current-Driven Magnetization Reversal and Spin-Wave Excitations in Co/Cu/Co Pillars", Physical Review Letters, vol. 84, No. 14, Apr. 3, 2000, pp. 3149-3152.

Yiming Huai et al;., "Observation of Spin-Transfer Switching in Deep Submicron-Sized and Low-Resistance Magnetic Tunnel Junctions", Applied Physics Letters, vol. 84, No. 16, Apr. 19, 2004, pp. 3118-3120.

S.I,. Kiselev et al., "Microwave Oscillations of a Nanomagnet Driven by a Spin-Polarized Current", Letters to Nature, vol. 425, Sep. 25, 2003, pp. 380-383.

A.A. Tulapurkar et al., "Spin-Torque Diode Effect in Magnetic Tunnel Junctions", Nature, vol. 438, Nov. 17, 2005, pp. 339-342.

* cited by examiner

*Primary Examiner*—Richard Elms
*Assistant Examiner*—Hien N Nguyen
(74) *Attorney, Agent, or Firm*—Stites & Harbison PLLC; Juan Carlos A. Marquez, Esq.

(57) ABSTRACT

A magnetic random access memory which employs spin torque magnetization reversal having a small write current value is applied. The memory includes: a switching element the conduction of which is controlled by a gate electrode, and three magnetoresistance effect elements connected to the switching element in series. Each magnetoresistance effect element may be a TMR element or a GMR element that includes a multilayered film composed of a fixed layer, a non-magnetic layer and a free layer. The central element serves as a storage element. The magnetoresistance effect elements are manufactured such that an absolute value of current necessary for changing a magnetization direction of at least one of the magnetoresistance effect elements located at both ends is larger than an absolute value of current necessary for changing a magnetization direction of the central magnetoresistance effect element.

9 Claims, 9 Drawing Sheets

*Prior Art*

MAGNETIC MEMORY AND METHOD FOR WRITING TO MAGNETIC MEMORY

CLAIM OF PRIORITY

The present application claims priority from Japanese application JP 2007-333872 filed on Dec. 26, 2007, the content of which is hereby incorporated by reference into this application.

BACKGROUND OF THE INVENTION

1. Field of the Invention

The present invention relates to a magnetic memory and a magnetic random access memory that employ spin torque magnetization reversal.

2. Description of the Related Art

In recent years, attention has been paid to a magnetic random access memory (MRAM) which can possibly replace the conventional dynamic random access memory (DRAM). As described in, for example, the specification of U.S. Pat. No. 5,734,605, the conventional MRAM employs the following recording system. Specifically, in a tunnel magnetoresistance effect element (TMR) having a multi-layer structure of magnetic film/non-magnetic insulating film/magnetic film, a magnetization of one of the magnetic films is reversed by using a synthetic magnetic field produced by current flowing into two metal wires formed in a direction perpendicular to the vertical direction of the TMR element. However, even in the MRAM, when the size of the TMR element is reduced to increase capacity, the size of the magnetic field necessary for magnetization reversal is increased, thereby requiring a large amount of current flowing into the metal wires. Thus, problems have been pointed out, including an increase in power consumption, and by extension, breakage of the wires.

A method for reversing magnetization without using the magnetic field is described in, for example, Journal of Magnetism and Magnetic Materials, 159, L1-7 (1996). It has been logically shown that the magnetization can be reversed only by making current of a predetermined value or more to flow into a giant magnetoresistance effect (GMR) film or a tunnel magnetoresistance effect (TMR) film, which is used in magnetic reproducing heads. After that, Physical Review Letters, Vol. 84, No. 14, pp. 3149-3152 (2000), for example, has reported an experimental example of the following recoding system. Specifically, a pillar having a multilayer (GMR film) of Co/Cu/Co and a diameter of 130 nm is formed between two Cu electrodes. Current is made to flow into the pillar. Spin of the flowing current gives spin torque to the magnetization of the Co layer, thereby reversing the magnetization of the Co layer. Moreover, in recent years, spin torque magnetization reversal has been demonstrated by use of a nano-pillar employing a TMR film, as described in, for example, Applied Physics Letters, Vol. 84, pp. 3118-3120 (2004). Being able to obtain output equal to or more than that obtained by the conventional MRAM, the spin torque magnetization reversal using a TMR film is particularly drawing much attention.

Figure 1A:
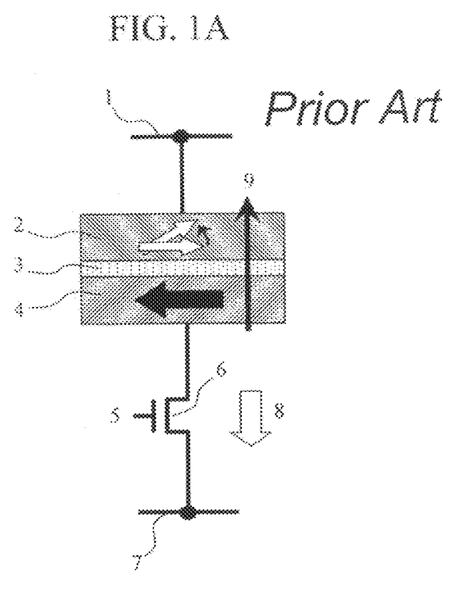
FIGS. 1A and 1B are views of illustrating a principle of spin torque magnetization reversal, 1A is a view illustrating magnetization reversal from an antiparallel state to a parallel state, and 1B is a view illustrating magnetization reversal from a parallel state to an antiparallel state.
Figure 1B:
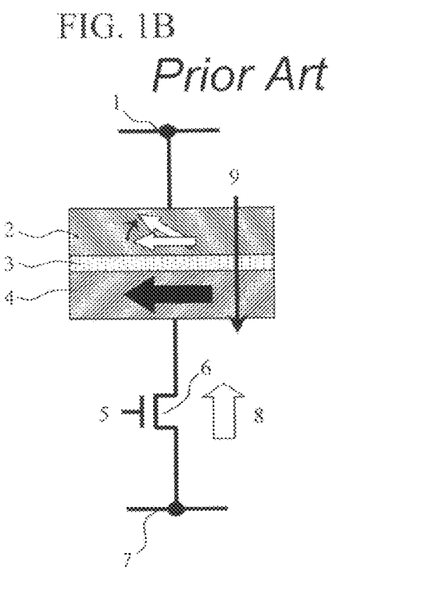

FIGS. 1A and 1B illustrate schematic views of the aforementioned spin torque magnetization reversal. In FIGS. 1A and B, a magnetoresistance effect element and one terminal of a transistor 6 are connected to a bit line 1. The other terminal of the transistor 6 is connected to a source line 7. The magnetoresistance effect element employed here includes a first ferromagnetic layer (free layer) 2 whose magnetization direction changes, an intermediate layer 3, and a second ferromagnetic layer (fixed layer) 4 whose magnetization direction is fixed. The conduction of the transistor 6 is controlled by a gate electrode 5. As illustrated in FIG. 1A, a current 8 is made to flow from the bit line 1 to the source line 7 in order to change magnetizations of the fixed layer 4 and the free layer 2 from an antiparallel (high resistance) state to a parallel (low resistance) state. At this time, an electron 9 flows from the source line 7 to the bit line 1. On the other hand, as illustrated in FIG. 1B, the current 8 is made to flow from the source line 7 to the bit line 1 in order to change the magnetizations of the fixed layer 4 and the free layer 2 from the parallel (low resistance) state to the antiparallel (high resistance) state. At this time, the electron 9 flows from the bit line 1 to the source line 7.

Figure 2:
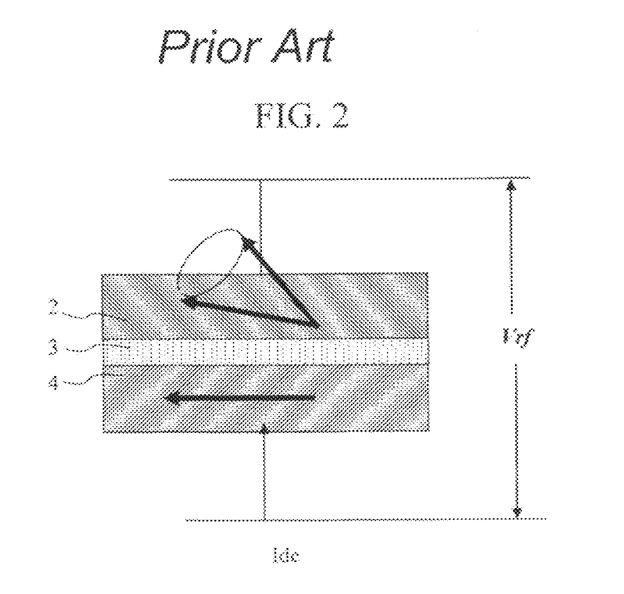
FIG. 2 is a view illustrating a principle of an oscillator to which a spin torque effect is applied.
Figure 3:
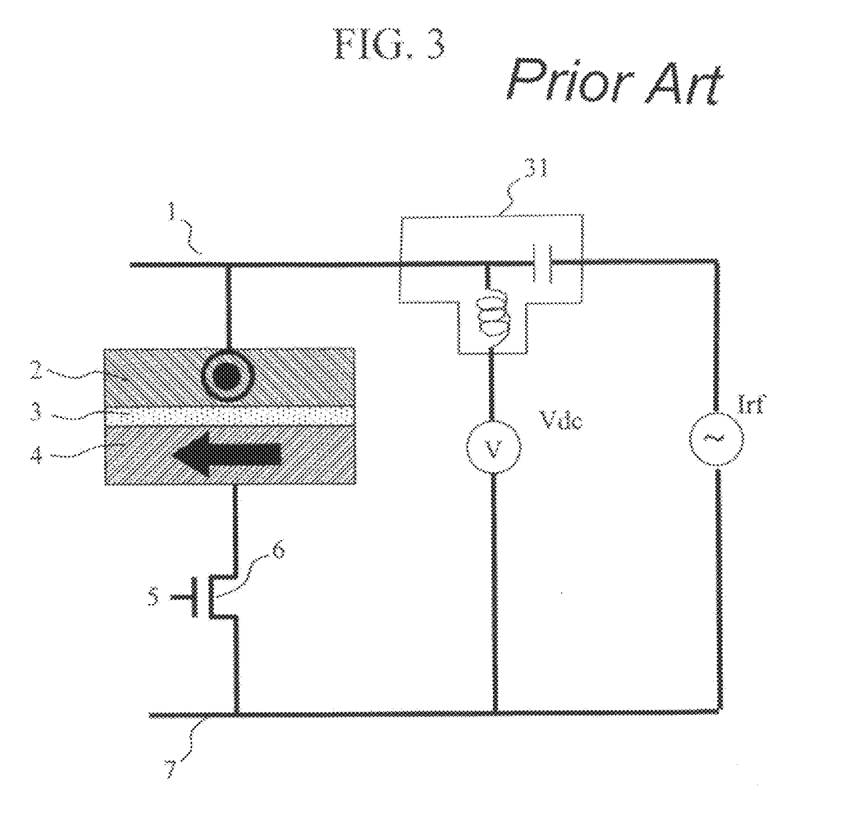
FIG. 3 is a view illustrating a principle of a spin torque diode effect.

Further, for example, Nature, Vol. 425, pp. 380-383 (2003) has recently proposed the following spin torque oscillator including a magnetoresistance effect element which is formed by laminating a free layer 2, an intermediate layer 3 and a fixed layer 4, as illustrated in FIG. 2. Specifically, in order to excite precession in magnetization of the free layer 2, current $I_{dc}$ smaller than current necessary for spin torque magnetization reversal of the free layer 2 is made to flow into both sides of the magnetoresistance effect element. As a result, an alternating-current voltage of the element on both sides is excited through a giant magnetoresistance effect or tunnel magnetoresistance effect. Furthermore, for example, Nature, Vol. 438, pp. 339-342 (2005) has proposed the following new element. Specifically, as illustrated in FIG. 3, an alternating current with a frequency of the order of GHz is made to flow into a magnetoresistance effect element through a bias T31 to conversely take out a DC voltage $V_{dc}$.

SUMMARY OF THE INVENTION

However, the following problems exist in the TMR type MRAM employing the conventional spin torque magnetization reversal.

When a large-capacity high-integrated memory is manufactured by employing the spin torque magnetization reversal, an area of the transistor connected to the TMR element is reduced. As a result, an amount of current that can flow into the TMR element is also reduced. Therefore, in order to achieve a large-capacity high-integrated memory, a threshold current density value $J_c$ of the spin torque magnetization reversal needs to be reduced. At present, $J_c$ up to $2.2 \times 10^6$ (A/cm$^2$) is achieved as described in, for example, Applied Physics Letters, Vol. 87, p. 225210 (2005). However, it is considered to be very difficult to further reduce this value in the future while ensuring thermal stability which is important for a nonvolatile memory.

Moreover, the spin torque oscillator illustrated in FIG. 2 has a problem in that its maximum output is as small as about 1 μW. Further, although having sufficiently large output, the spin torque diode illustrated in FIG. 3 has a problem in how a high-frequency current of the order of GHz is made to flow into the TMR element when the spin torque diode is incorporated into an actual integrated circuit. To be more specific, when an alternating-current oscillator is installed at a location far away from the element, an alternating current may leak from the middle of the wire connecting the oscillator to the element, thus not reaching the TMR element. Furthermore, another big problem is how to structure the alternating-current oscillator at low cost.

A magnetic memory of the present invention includes a magnetic memory element having a fixed layer and a free layer laminated with a non-magnetic layer interposed therebetween, and which performs recording based on a magnetization direction of the free layer with respect to a magnetization direction of the fixed layer. The magnetic memory also includes: a first auxiliary element having a fixed layer and a free layer laminated with a non-magnetic layer interposed therebetween, the fixed layer and the free layer having magnetization directions that are antiparallel to each other; a second auxiliary element having a fixed layer and a free layer laminated with a non-magnetic layer interposed therebetween, the fixed layer and the free layer having magnetization directions that are parallel to each other; a means for making current to vertically flow into a film surface of the magnetic memory element through the first auxiliary element; and a means for making current to vertically flow into a film surface of the magnetic memory element through the second auxiliary element.

In the magnetic memory, an absolute value of current necessary for changing the magnetization direction of the free layer of the magnetic memory element from an antiparallel state to a parallel state with respect to the magnetization direction of the fixed layer of the magnetic memory element is smaller than an absolute value of current necessary for changing the magnetization direction of the free layer of the first auxiliary element to the parallel state with respect to the magnetization direction of the fixed layer of the first auxiliary element. Moreover, an absolute value of current necessary for changing the magnetization direction of the free layer of the magnetic memory element from the parallel state to the antiparallel state with respect to the magnetization direction of the fixed layer of the magnetic memory element is smaller than an absolute value of current necessary for changing the magnetization direction of the free layer of the second auxiliary element to the antiparallel state with respect to the magnetization direction of the fixed layer of the second auxiliary element. Moreover, the first auxiliary element and the second auxiliary element are connected to each other in series with the magnetic memory element interposed therebetween.

More preferably, in the magnetic memory, $Idc11>Idc21>Idc31$, and $Idc12<Idc22<Idc32$ where: $Idc11$ represents an absolute value of current by which the magnetization directions of the fixed layer and the free layer of the first auxiliary element are changed from the antiparallel state to the parallel state; $Idc12$ represents an absolute value of current by which the magnetization directions of the fixed layer and the free layer of the first auxiliary element are changed from the parallel state to the antiparallel state;

$Idc21$ represents an absolute value of current by which the magnetization directions of the fixed layer and the free layer of the magnetic memory are changed from the antiparallel state to the parallel state; $Idc22$ represents an absolute value of current by which the magnetization directions of the fixed layer and the free layer of the magnetic memory are changed from the parallel state to the antiparallel state; $Idc31$ represents an absolute value of current by which the magnetization directions of the fixed layer and the free layer of the second auxiliary element are changed from the antiparallel state to the parallel state; and $Idc32$ represents an absolute value of current by which the magnetization directions of the fixed layer and the free layer of the second auxiliary element are changed from the parallel state to the antiparallel state.

Further, a magnetic memory of the present invention includes a magnetic memory element having a fixed layer and a free layer laminated with a non-magnetic layer interposed therebetween, and which performs recording based on a magnetization direction of the free layer with respect to a magnetization direction of the fixed layer. The magnetic memory also includes: a first auxiliary element that generates high-frequency oscillation; a means for making a direct-current pulse current to flow into a film surface of the magnetic memory element vertically in a direction from the free layer to the fixed layer, the direct-current pulse current being superimposed by a high-frequency current generated by the first auxiliary element; a second auxiliary element that generates high-frequency oscillation; and a means for making a direct-current pulse current to flow into a film surface of the magnetic memory element vertically in a direction from the fixed layer to the free layer, the direct-current pulse current being superimposed by a high-frequency current generated by the second auxiliary element. The first auxiliary element and the second auxiliary element are connected to each other in series with the magnetic memory element interposed therebetween.

Furthermore, in a method for writing to a magnetic memory of the present invention, the magnetic memory includes: a magnetic memory element having a fixed layer and a free layer laminated with a non-magnetic layer interposed therebetween; a first auxiliary element having a fixed layer and a free layer laminated with a non-magnetic layer interposed therebetween, the fixed layer and the free layer having magnetization directions that are antiparallel to each other; and a second auxiliary element having a fixed layer and a free layer laminated with a non-magnetic layer interposed therebetween, the fixed layer and the free layer having magnetization directions that are parallel to each other. The first auxiliary element and the second auxiliary element are connected to each other in series with the magnetic memory element interposed therebetween. In the method, an absolute value of current necessary for changing a magnetization direction of the free layer of the magnetic memory element from an antiparallel state to a parallel state with respect to a magnetization direction of the fixed layer of the magnetic memory element is smaller than an absolute value of current necessary for changing the magnetization direction of the free layer of the first auxiliary element to the parallel state with respect to the magnetization direction of the fixed layer of the first auxiliary element. Moreover, an absolute value of current necessary for changing the magnetization direction of the free layer of the magnetic memory element from the parallel state to the antiparallel state with respect to the magnetization direction of the fixed layer of the magnetic memory element is smaller than an absolute value of current necessary for changing the magnetization direction of the free layer of the second auxiliary element to the antiparallel state with respect to the magnetization direction of the fixed layer of the second auxiliary element. The method performs recording based on the magnetization direction of the free layer of the magnetic memory element with respect to the magnetization direction of the fixed layer of the magnetic memory element.

In the writing method, when the magnetization direction of the free layer of the magnetic memory element is to be changed from the antiparallel state to the parallel state with respect to the magnetization direction of the fixed layer of the magnetic memory element, a current pulse is applied in a direction from the first auxiliary element to the magnetic memory element, the current pulse having an absolute value smaller than that of current necessary for reversing the magnetization direction of the free layer of the magnetic memory element. Moreover, when the magnetization direction of the free layer of the magnetic memory element is to be changed from the parallel state to the antiparallel state with respect to the magnetization direction of the fixed layer of the magnetic memory element, a current pulse is applied in a direction from the second auxiliary element to the magnetic memory element, the current pulse having an absolute value smaller than that of current necessary for reversing the magnetization direction of the free layer of the magnetic memory element.

The present invention can provide a magnetic random access memory having small write current by use of spin torque magnetization reversal with low power consumption.

DESCRIPTION OF THE PREFERRED EMBODIMENTS

The following will give a detailed description of the present invention with reference to the accompanying drawings.

Figure 4:
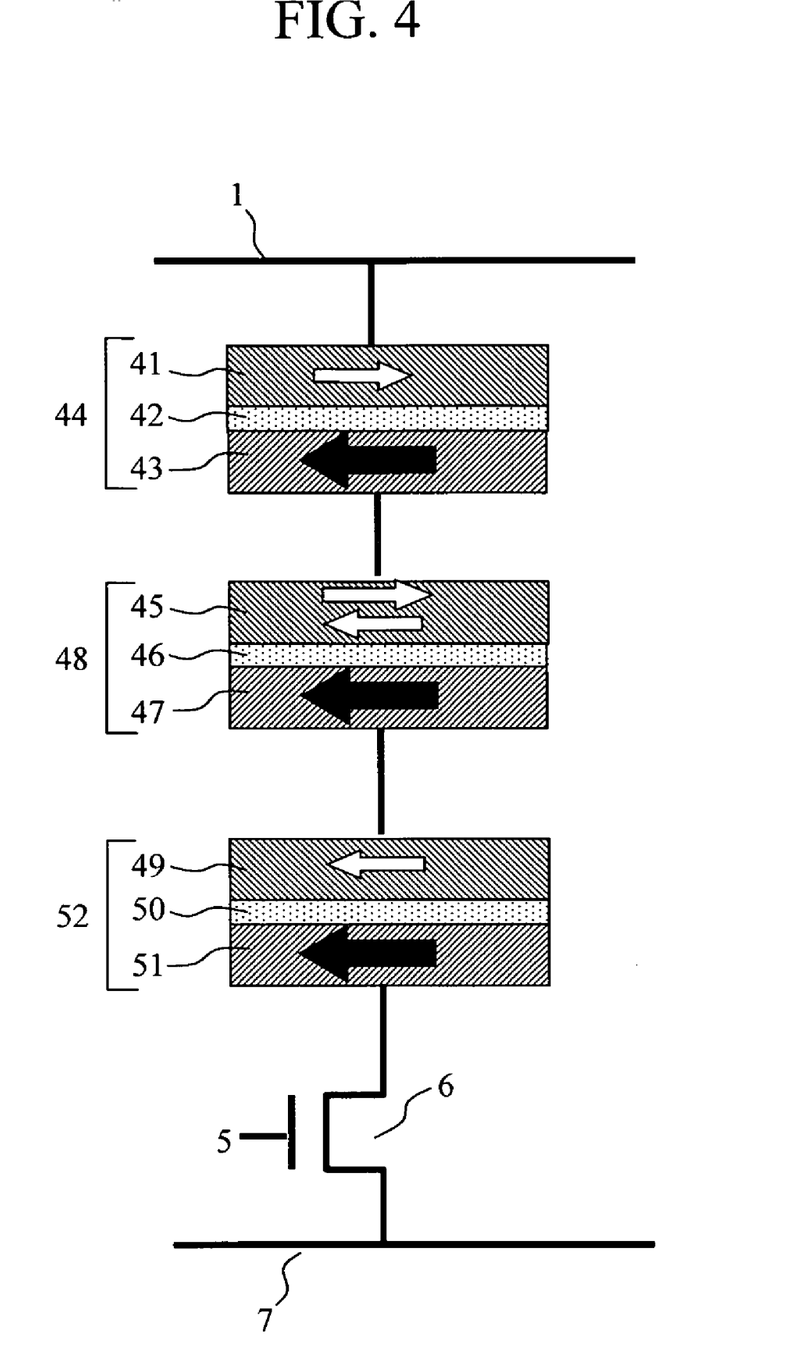
FIG. 4 is a view illustrating a specific structure of three magnetoresistance effect elements used in the present invention.

FIG. 4 illustrates main structural components of a magnetic memory according to the present invention. The magnetic memory includes three magnetoresistance effect elements 44, 48 and 52. The first magnetoresistance effect element (first auxiliary element) 44 has: a first ferromagnetic film 43 in which a magnetization direction is fixed by some method such as, for example, an exchange-coupling force from an antiferromagnetic film; a non-magnetic intermediate layer 42; and a second ferromagnetic layer 41 in which a magnetization direction is directed in a direction antiparallel to the magnetization direction of the fixed layer. In a case of a tunnel magnetoresistance effect element, an insulation film is used as the intermediate layer 42. The second (central) magnetoresistance effect element 48 has: a first ferromagnetic film (fixed layer) 47 in which a magnetization direction is fixed by some method such as, for example, an exchange-coupling force from an antiferromagnetic film; a non-magnetic intermediate layer 46; and a second ferromagnetic layer (free layer) 45 in which a magnetization direction is directed in a direction parallel or antiparallel to the magnetization direction of the fixed layer. In a case of a tunnel magnetoresistance effect element, an insulation film is used as the intermediate layer 46. The second (central) magnetoresistance effect element 48 functions as a memory element. The third magnetoresistance effect element (second auxiliary element) 52 has: a first ferromagnetic film 51 in which a magnetization direction is fixed by some method such as, for example, an exchange-coupling force from an antiferromagnetic film; a non-magnetic intermediate layer 50; and a second ferromagnetic layer 49 in which a magnetization direction is directed in a direction parallel to a fixed layer magnetization direction. In a case of a tunnel magnetoresistance effect element, an insu-lation film is used as the intermediate layer 50. A CMOS transistor is generally used as a switch element 6 for making current to flow into the three magnetoresistance effect elements 44, 48 and 52. Reference numeral 1 is a bit line (BL), 5 is a gate electrode that controls resistance of a transistor, and 7 is a source line (SL).

Figure 5:
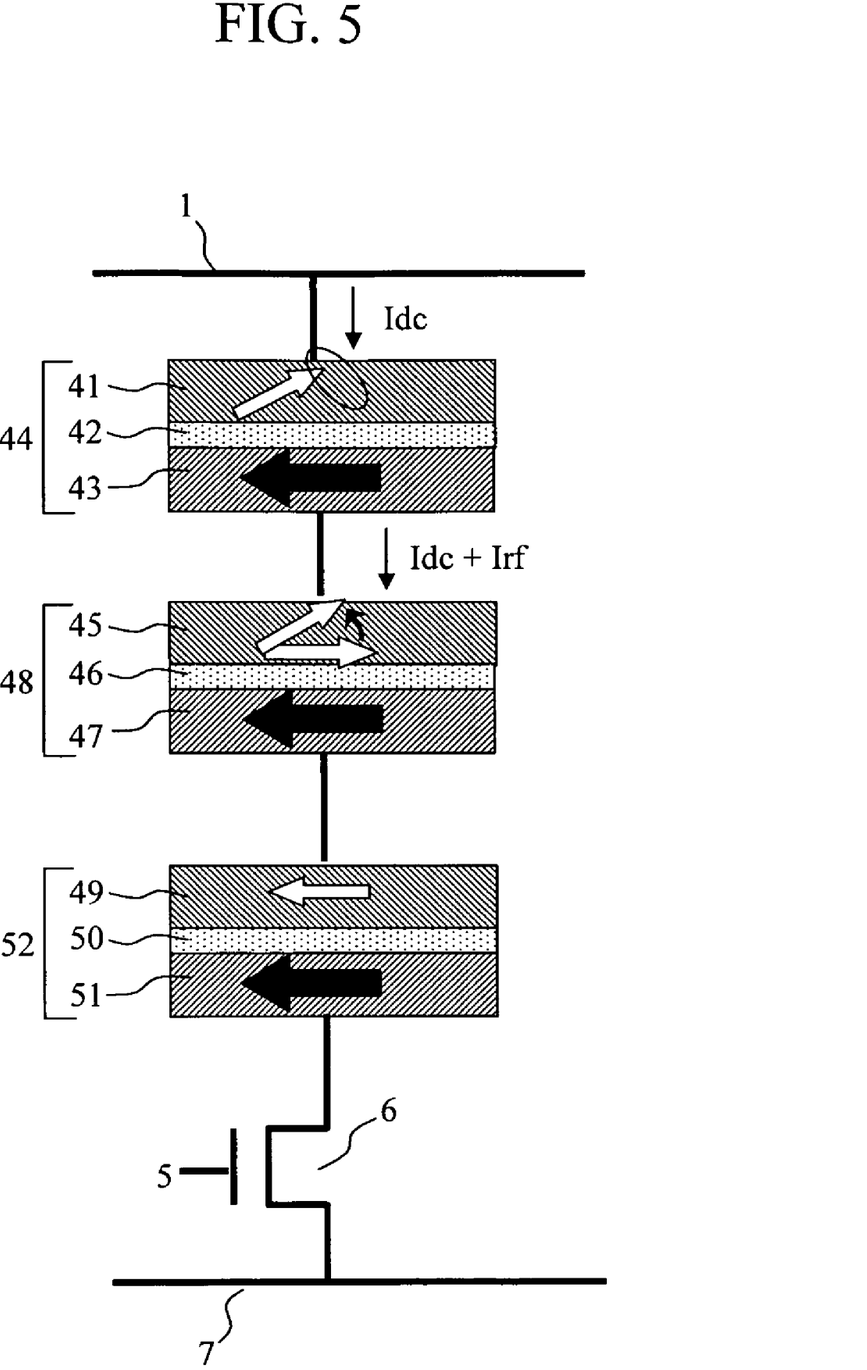
FIG. 5 is a view illustrating a writing method from an antiparallel sate to a parallel state.

An explanation will be next given of a memory writing operation. FIG. 5 is an explanatory view of a writing operation performed when the magnetization direction of the free layer 45 of the second magnetoresistance effect element 48 in FIG. 4 is antiparallel to the magnetization direction of the fixed layer 47 (high resistance state). First, a voltage is applied to the gate electrode 5 to turn on the transistor 6. Next, the bit line 1 is boosted to flow a current $-Idc00$ into the magnetoresistance effect element 44. In this case, a value of $-Idc00$ is set such that its absolute value is smaller than that of a current $-Idc11$ by which the magnetization of the free layer 41 of the first magnetoresistance effect element 44 is reversed. The magnetization of the free layer 41 of the first magnetoresistance effect element 44 is affected by spin torque due to the current $-Idc00$, and precession is thus performed. When the direction of the free layer 41 of the first magnetoresistance effect element 44 is changed by the precession, resistance is changed with time by a magnetoresistance effect, to generate an alternating current Irf in proportional to the change in resistance. The alternating current Irf is superimposed on the current $-Idc00$ originally applied to the magnetoresistance effect element 44, and then flows into the second magnetoresistance effect element 48. An absolute value of an original threshold current value $-Idc21$ of the second magnetoresistance effect element 48 is larger than that of the current $-Idc00$. However, precession of the free layer 45 of the second magnetoresistance effect element 48 is amplified by the alternating current Irf generated by the first magnetoresistance effect element 44, and therefore the magnetization reversal occurs even by the current $-Idc00$ whose absolute value is smaller than that of the current $-Idc21$. Namely, this provides an effect of effectively reducing the threshold current value of the second magnetoresistance effect element 48 used as a memory.

Figure 6:
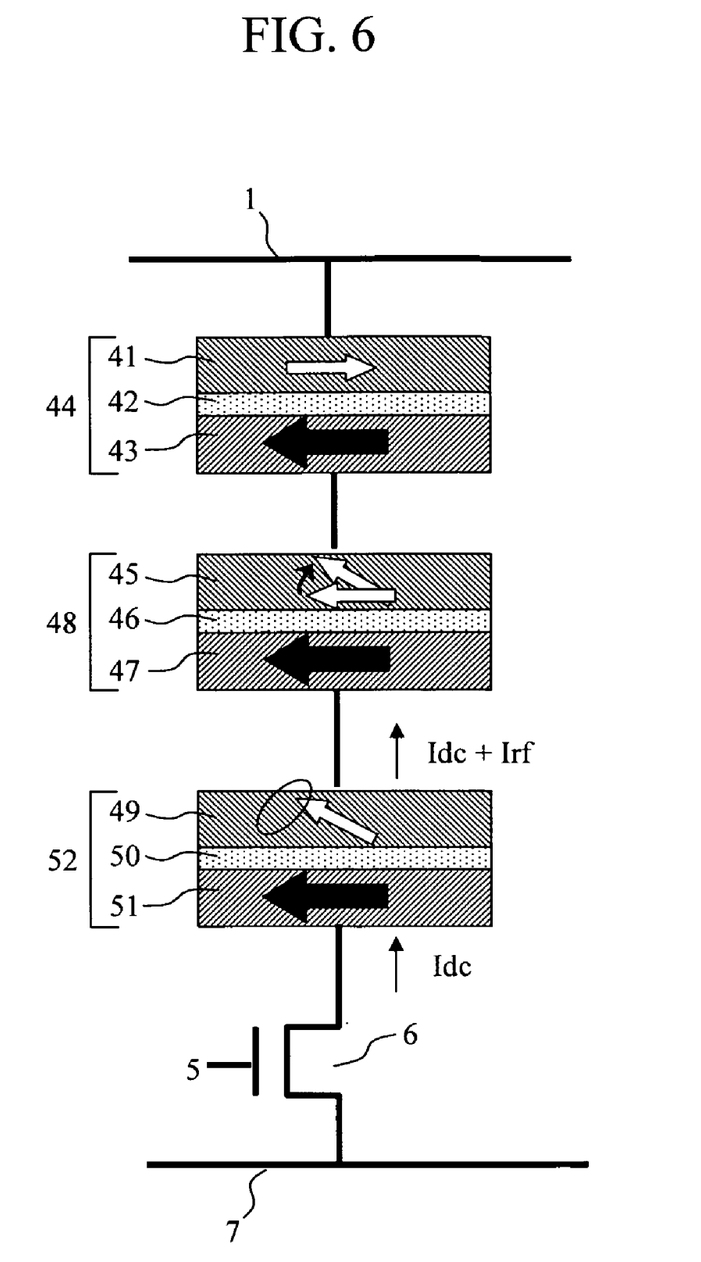
FIG. 6 is a view illustrating a writing method from a parallel state to an antiparallel state.

FIG. 6 is an explanatory view of a writing operation performed when the magnetization direction of the free layer 45 of the second magnetoresistance effect element 48 in FIG. 4 is parallel to the magnetization direction of the fixed layer 47 (low resistance state). First, a voltage is applied to the gate electrode 5 to turn on the transistor 6. Next, the source line 7 is boosted to flow a current $+Idc01$ into the third magnetoresistance effect element 52. In this case, a value of the current $+Idc01$ is set such that its absolute value is smaller than that of a current $+Idc32$ by which the magnetization of the free layer 49 of the third magnetoresistance effect element 52 is reversed. Spin torque by the current $+Idc01$ affects the magnetization of the free layer 49 of the third magnetoresistance effect element 52, and precession is thus performed. When the direction of the free layer 49 is changed by the precession, resistance is changed with time by a magnetoresistance effect, to generate an alternating current Irf in proportional to the change in resistance. The alternating current Irf is superimposed on the current $+Idc01$ originally applied to the third magnetoresistance effect element 52, and then flows into the second magnetoresistance effect element 48. An original threshold current value $+Idc22$ of the second magnetoresistance effect element 48 is larger than the current $+Idc01$. However, precession of the free layer 45 of the second magnetoresistance effect element 48 is amplified by the alternating current Irf generated by the third magnetoresistance effect element 52, and therefore magnetization reversal occurs even by the current +Idc01 smaller than the current +Idc22.

Figure 7:
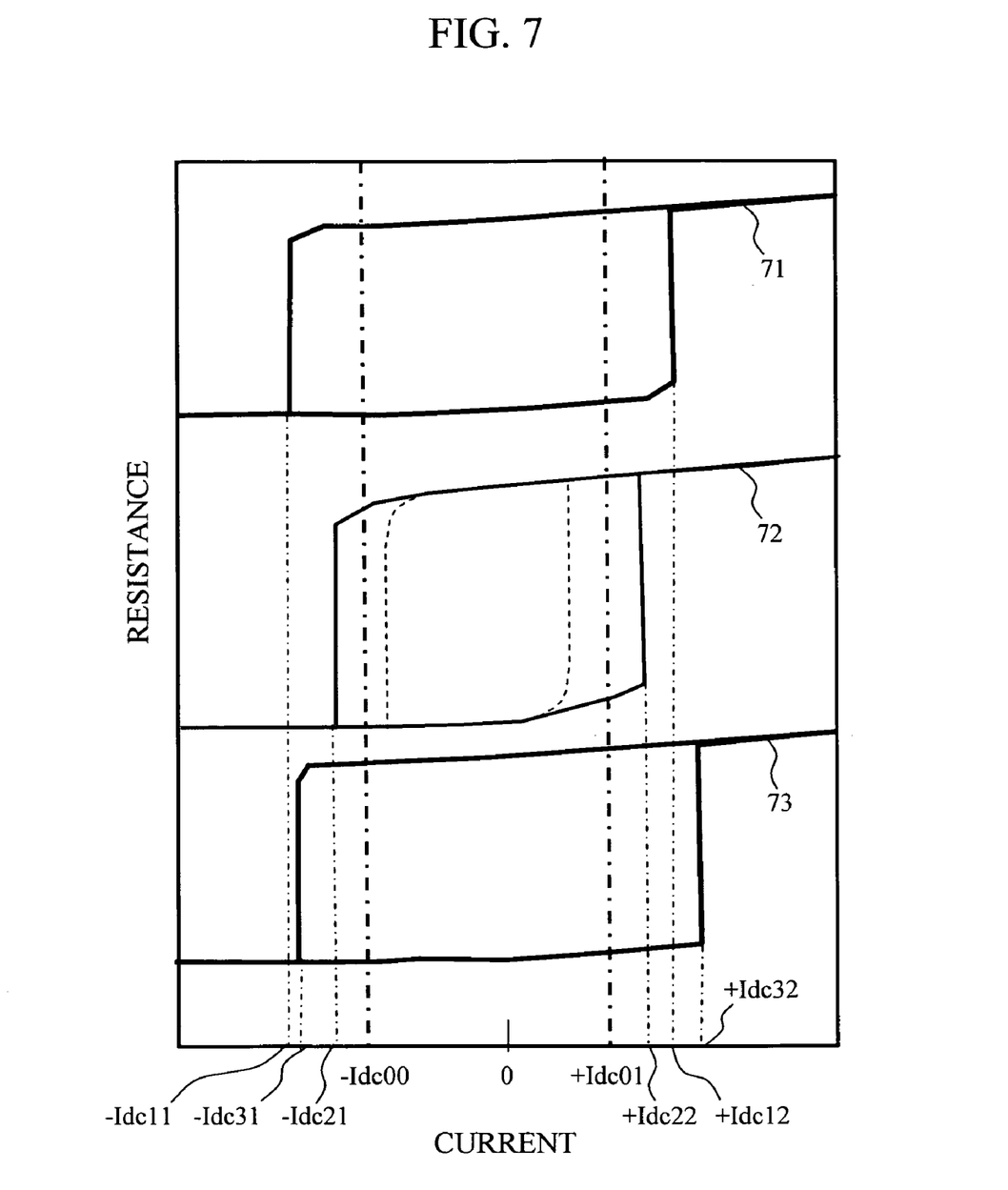
FIG. 7 is a view illustrating current-resistance hysteresis of three magnetoresistance effect elements.

FIG. 7 illustrates one example of a relationship between resistance and current used in the above description. Reference numeral 71 denotes a current-resistance hysteresis when the first magnetoresistance effect element (first auxiliary element) 44 singly exists. −Idc11 is a threshold current for magnetization reversal, in which the magnetization directions of the fixed layer and the free layer are changed from an antiparallel state to a parallel state. Moreover, +Idc12 is a threshold current for magnetization reversal from a parallel state to an antiparallel state. Hereinafter, a state in which the magnetization directions of the fixed layer and the free layer are antiparallel to each other is simply called an antiparallel state; a state in which the magnetization directions of the fixed layer and the free layer are parallel to each other is simply called a parallel state.

Reference numeral 73 denotes a current-resistance hysteresis when the third magnetoresistance effect element (first auxiliary element) 52 singly exists. +Idc32 is a threshold current for magnetization reversal from the parallel state to the antiparallel state. Moreover, −Idc31 is a threshold current for magnetization reversal to the parallel state.

Reference numeral 72 denotes a current-resistance hysteresis when the second magnetoresistance effect element 48, which is used as a memory, singly exists. −Idc21 is a threshold current for magnetization reversal from the antiparallel state to the parallel state, and its absolute value is smaller than that of −Idc11. Then, the current −Idc00 is made to flow into these magnetoresistance effect elements. As described above, the alternating current Irf to be superimposed on the current −Idc00 is generated in the first magnetoresistance effect element 44. The hysteresis 72 changes as illustrated by a broken line by an effect of the alternating current Irf, so that the absolute value of the threshold value is reduced. As a result, the magnetization reversal of the second magnetoresistance effect element 48 occurs by the current value −Idc00 by which no magnetization reversal occurs when the second magnetoresistance effect element 48 singly exists.

Meanwhile, +Idc22 is a threshold current for magnetization reversal of the second magnetoresistance effect element 48 from the parallel state to the antiparallel state, and its absolute value is smaller than the threshold current +Idc32 by which the third magnetoresistance effect element 52 transits from the parallel state to the antiparallel state. When the current +Idc01 is made to flow into these magnetoresistance effect elements, the alternating current Irf to be superimposed on +Idc01 is generated in the third magnetoresistance effect element 52 as described above. The hysteresis 72 changes as illustrated by a broken line by an effect of the alternating current Irf, so that the absolute value of the threshold value is reduced. As a result, the magnetization reversal of the second magnetoresistance effect element 48 occurs by the current value +Idc01 by which no magnetization reversal occurs when the second magnetoresistance effect element 48 singly exists.

Figure 8:
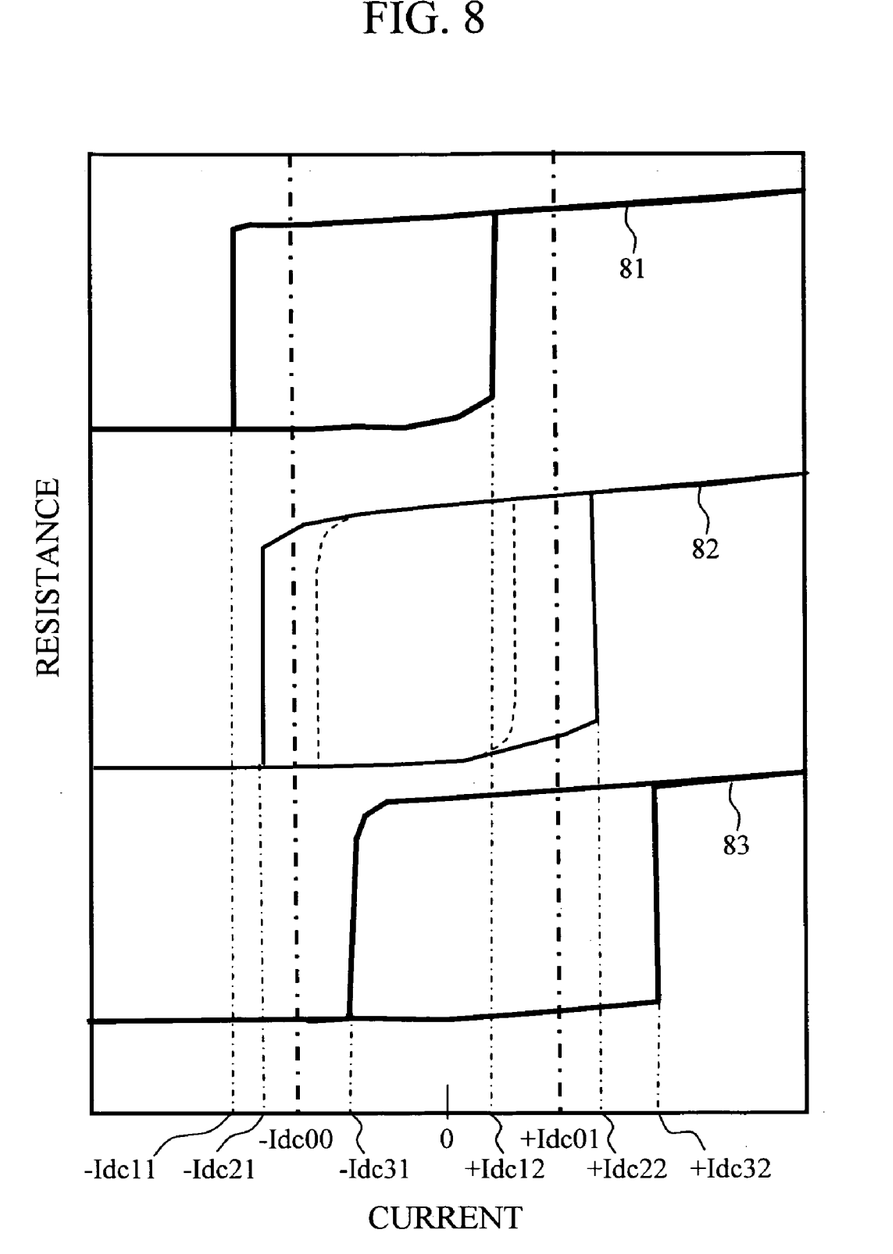
FIG. 8 is a view illustrating current-resistance hysteresis of three magnetoresistance effect elements.

FIG. 8 illustrates an example in which a current threshold value satisfies a special relationship when each of the magnetoresistance effect elements singly exists. Reference numeral 81 denotes a current-resistance hysteresis when the first magnetoresistance effect element (first auxiliary element) 44 singly exists. −Idc11 is a threshold current for magnetization reversal from the antiparallel state to the parallel state. Here, what should be noted is that the absolute value of the current +Idc12 of the current threshold value for magnetization reversal of the first magnetoresistance effect element 44 from the parallel state to the antiparallel state is smaller than the absolute value of the current threshold value of each of the second and third magnetoresistance effect elements. Therefore, when the second magnetoresistance effect element 48 is switched from the parallel state to the antiparallel state by a current in the positive direction, the magnetization state of the first magnetoresistance effect element 44 is always automatically set to the antiparallel state.

Reference numeral 82 denotes a current-resistance hysteresis when the second magnetoresistance effect element 48 used as a memory singly exists. −Idc21 is a threshold current for magnetization reversal from the antiparallel state to the parallel state, and its absolute value is smaller than that of the current −Idc11. Then, the current −Idc00 is caused to flow into these magnetoresistance effect elements. As described above, the alternating current Irf to be superimposed on the current −Idc00 is generated in the first magnetoresistance effect element 44. The hysteresis 82 changes as illustrated by a broken line by an effect of the alternating current Irf, so that the absolute value of the threshold value is reduced. As a result, the magnetization reversal of the second magnetoresistance effect element 48 occurs by the current value −Idc00 by which no magnetization reversal occurs when the second magnetoresistance effect element 48 singly exists.

Meanwhile, +Idc22 is a threshold current for magnetization reversal of the second magnetoresistance effect element 48 from the parallel state to the antiparallel state, and its absolute value is smaller than the threshold current +Idc32 by which the third magnetoresistance effect element 52 transits from the parallel state to the antiparallel state. When the current +Idc01 is made to flow into these magnetoresistance effect elements, the alternating current Irf to be superimposed on the current +Idc01 is generated in the third magnetoresistance effect element 52 as described above. The hysteresis 82 changes as illustrated by a broken line by an effect of the alternating current Irf, so that the absolute value of the threshold value is reduced. As a result, the magnetization reversal of the second magnetoresistance effect element 48 occurs by the current value +Idc01 by which no magnetization reversal occurs when the second magnetoresistance effect element 48 singly exists.

Likewise, reference numeral 83 denotes a current-resistance hysteresis when the third magnetoresistance effect element (second auxiliary element) 52 singly exists. +Idc32 is a threshold current for magnetization reversal from the parallel state to the antiparallel state. Here, what should be noted is that the absolute value of the current threshold value −Idc31 for magnetization reversal of the third magnetoresistance effect element 52 from the antiparallel state to the parallel state is smaller than the absolute value of the current threshold value of each of the first and second magnetoresistance effect elements. Therefore, when the second magnetoresistance effect element 48 is switched from the parallel state to the antiparallel state by a current in the negative direction, the magnetization state of the third magnetoresistance effect element 52 is always automatically set to the antiparallel state.

Figure 9A:
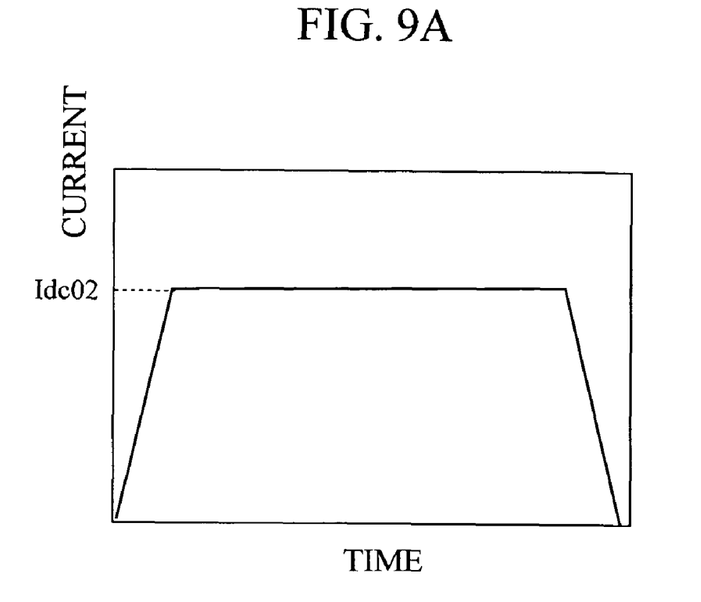
FIG. 9 is a view illustrating a write waveform.
Figure 9B:
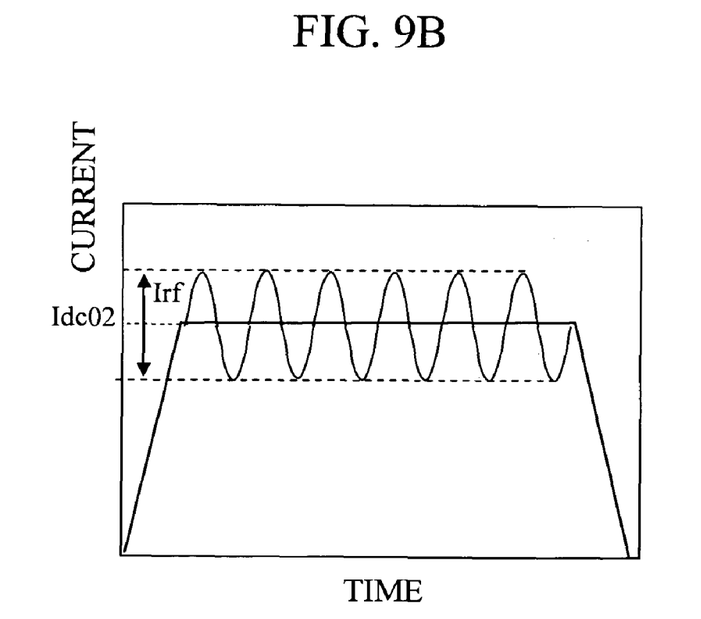

FIG. 9 is a view illustrating an example of a waveform of a current flowing into a magnetoresistance effect element. This example shows a process of magnetization reversal from the parallel state to the antiparallel state. FIG. 9A illustrates a waveform of a current pulse applied to the third magnetoresistance effect element 52. This is a trapezoidal current waveform having a predetermined time (typically, 1 ns to 100 ns) and a fixed current value (typically, 30 μA to 500 μA). FIG. 9B illustrates a waveform of a current output from the third magnetoresistance effect element 52. As shown in the current waveform shown in FIG. 9B, an alternating current Irf (typically, 50 to 500 μA) generated by the third magnetoresistance effect element is superimposed on the trapezoidal current waveform in FIG. 9A.

The above example can be applied to cases of using any of a GMR element and a TMR element as the magnetoresistance effect element. The following will show more specific embodiments.

EXAMPLE 1

Example in Which All of the Three Magnetoresistance Effect Elements are a TMR Element As already described, the TMR element shows a considerably higher resistance change rate than the GMR element, and therefore is suitable for a memory element. Moreover, when used as a spin torque oscillator, the TMR element can obtain considerably higher current amplitude Irf than when the GMR element is used, and therefore this example is one of the most realistic combinations.

The second TMR element used as a memory element has a film structure of Ta/NiFe/IrMn/CoFe/Ru/CoFeB/MgO/CoFeB/Ru/CoFeB/cap. IrMn is an antiferromagnetic film which fixes magnetization to one direction. CoFe/Ru/CoFeB is a synthetic ferri-fixed layer in which CoFe and CoFeB are exchange-coupled to each other through Ru. MgO is a barrier layer having a film thickness of about 0.9 nm. CoFeB/Ru/CoFeB is a synthetic ferri-free layer in which CoFeB and CoFeB are exchange-coupled to each other through Ru. Using the synthetic ferri-free layer makes it possible to achieve a positive-negative symmetrical current-resistance hysteresis in which the absolute value of −Idc21 and that of +Idc22 are substantially equal to each other. A pillar size is 80×160 nm.

Measurement was made on characteristics of a single TMR element manufactured on the same substrate as a reference for the second TMR element. The result showed that resistance in the parallel state was 1 kΩ, and current threshold values were −Idc21=−0.2 (mA) and +Idc22=0.3 mA. A TMR ratio is about 100%, and a resistance value at a low bias current in the antiparallel state is about 2 kΩ. A first TMR element and a third TMR element were designed based on the above data.

First, regarding the first TMR element 44, in order for the absolute value of the threshold current value on a negative side to be 0.3 mA or more, the film thickness of CoFeB in the fixed layer was reduced so that the free layer may have a magnetic field offset in the negative direction. The other film structure and the film thickness of MgO are the same as those of the second TMR element 48, and so is the pillar size. In a single TMR element manufactured on the same substrate as a reference for the first TMR element 44, resistance in the parallel state was 1 kΩ, and current threshold values were −Idc1=−0.3 (mA) and +Idc3=0.1 mA. Next, regarding the third TMR element 52, in order for the absolute value of the threshold current value on a negative side to be 0.4 mA or more, the film thickness of CoFeB of the fixed layer was increased so that the free layer may have a magnetic field offset in the positive direction. The other film structure and the film thickness of MgO are the same as those of the second TMR element 48, and so is the pillar size. In a single TMR element manufactured on the same substrate as a reference for the first TMR element, resistance in the parallel state was 1 kΩ, and current threshold values were −Idc1=−0.1 (mA) and +Idc3=0.4 mA.

Then, an experiment was conducted on a nano-pillar in which the above films were laminated. Magnetic-film-reactive ion beam etching was used to process the nano-pillar to carry out processing with a good verticality. A current of +0.5 mA was made to flow into the completed element, and the three TMR elements were arranged to have magnetization in an antiparallel state. Under this state, the current to the first TMR element side was gradually increased to the minus direction, and the following was confirmed. Specifically, the resistance value was decreased by 1 kΩ at −0.1 mA to change the magnetization of only the third TMR element to the parallel state. Moreover, the resistance value was decreased by 1 kΩ at −0.12 mA to change the magnetization state of the second TMR element to the parallel state. Under this state, the current was set to zero to gradually increase a current value on the positive side, and the following was confirmed. Specifically, the resistance value was decreased by 1 kΩ at +0.15 mA to change the magnetization of the second TMR element 48 used as a memory went from the parallel state to the antiparallel state. At this time, the magnetization of the third TMR element 52 is still in the parallel state. By repeating this operation thereafter, the second TMR element 48 can function as a memory. In this case, with the magnetizations of the first TMR element 41 and the third TMR element 52 being fixed to the antiparallel state and to the parallel state, respectively, the magnetization of only the second TMR element 48 as a memory is switched between the parallel state and the antiparallel state.

Reversely, as an initial state, a current of −0.5 mA may be made to flow into the elements to make all the three TMR elements in the parallel state. In this case, when a current of +0.15 mA is made to flow into the elements, the magnetizations of the first and second TMR elements 44, 48 are changed from the parallel state to the antiparallel state. When a current of −0.12 mA is next made to flow into the elements, the magnetization of only the second TMR element 48 is changed from the antiparallel state to the parallel state. By repeating this operation thereafter, the second TMR element 48 can function as a memory. In this case, the magnetizations of the first TMR element 44 and the third TMR element 52 being fixed to the antiparallel state and to the parallel state, respectively, the magnetization of only the second TMR element 48 as a memory is switched from the parallel state to the antiparallel state.

EXAMPLE 2

Example in Which the Second Magnetoresistance Effect Element is a TMR Element and Other Magnetoresistance Effect Elements are GMR Elements As already described, the TMR element shows a considerably higher resistance change rate than that of the GMR element, and therefore is suitable for a memory element. Moreover, the GMR element has resistance lower than that of the TMR element, and therefore is suitable for the use when the entire resistance is to be decreased.

The second TMR element used as a memory element has a film structure of Ta/NiFe/IrMn/CoFe/Ru/CoFeB/MgO/CoFeB/Ru/CoFeB/cap. IrMn is an antiferromagnetic film which fixes magnetization to one direction. CoFe/Ru/CoFeB is a laminated ferri-fixed layer in which CoFe and CoFeB are exchange-coupled to each other through Ru. MgO is a barrier layer having a film thickness of about 0.9 nm. CoFeB/Ru/CoFeB is a laminated ferri-free layer in which CoFeB and CoFeB are exchange-coupled to each other through Ru. Using the laminated ferri-free layer makes it possible to achieve a positive-negative symmetrical current-resistance hysteresis in which the absolute value of −Idc21 and that of +Idc22 are substantially equal to each other. A pillar size is 80×160 nm.

GMR elements are used as the first and third magnetoresistance effect elements. A specific film structure employed was Ta/NiFe/IrMn/CoFe/Ru/CoFe/Cu/NiFe/CoFe/Ta. CoFe/Ru/CoFe is a laminated ferri-fixed layer in which CoFe and CoFe are exchange-coupled to each other through Ru. NiFe/CoFe is a free layer. Regarding the first GMR element, in order for the absolute value of the threshold current value on the negative side to be 0.3 mA or more, the film thickness of CoFe on the free layer side of the fixed layer was reduced so that the free layer may have a magnetic field offset in the negative direction. The film thickness of Cu was 3.2 nm. Regarding the third GMR element, in order for the absolute value of the threshold current value on the negative side to be 0.4 mA or more, the film thickness of CoFe on the free layer side of the fixed layer was increased so that the free layer may have a magnetic field offset in the positive direction. The film thickness of Cu is the same as that of the first GMR element.

Then, an experiment was conducted on a nano-pillar in which the above films were laminated. Magnetic-film-reactive ion beam etching was used to process the nano pillar to carry out processing with a good verticality. A current of +0.5 mA was made to flow into the completed element, and the three TMR elements were arranged to have magnetization in an antiparallel state. Under this state, the current was gradually increased from the first TMR element side to the minus direction, and the following was confirmed. Specifically, the resistance value was slightly decreased at −0.08 mA to change the magnetization state of only the third GMR element to the parallel state. Moreover, the resistance value was decreased by 1 kΩ at −0.15 mA to change the magnetization state of the second TMR element to the parallel state. Under this state, current was set to zero to gradually increase a current value on the positive side, and the following was confirmed. Specifically, the resistance value was increased by 1 kΩ at +0.2 mA to change the magnetization state of the second TMR element as a memory from the parallel state to the antiparallel state. At this time, the magnetization of the third GMR element is still in the parallel state. By repeating this operation thereafter, the second TMR element can function as a memory. In this case, with the magnetizations of the first GMR element and the third magnetization reversal element being fixed to the antiparallel state and to the parallel state, respectively, the magnetization of only the second TMR element as a memory is switched between the parallel state and the antiparallel state.

Reversely, as an initial state, a current of −0.5 mA may be made to flow into the elements to make all the three magnetoresistance effect elements in the parallel state. In this case, when a current of +0.2 mA is made to flow into the elements, the magnetizations of the first GMR element and the second TMR element changes from the parallel state to the antiparallel state. When a current of −0.12 mA is next made to flow into the elements, the magnetization of only the second TMR element changes from the antiparallel state to the parallel state. By repeating this operation thereafter, the second TMR element can function as a memory. In this case, with the magnetizations of the first GMR element and the third GMR element being fixed to the antiparallel state and to the parallel state, respectively, the magnetization of only the second TMR element as a memory is switched between the parallel state and the antiparallel state.

EXAMPLE 3

Memory Cell Structure

Figure 10A:
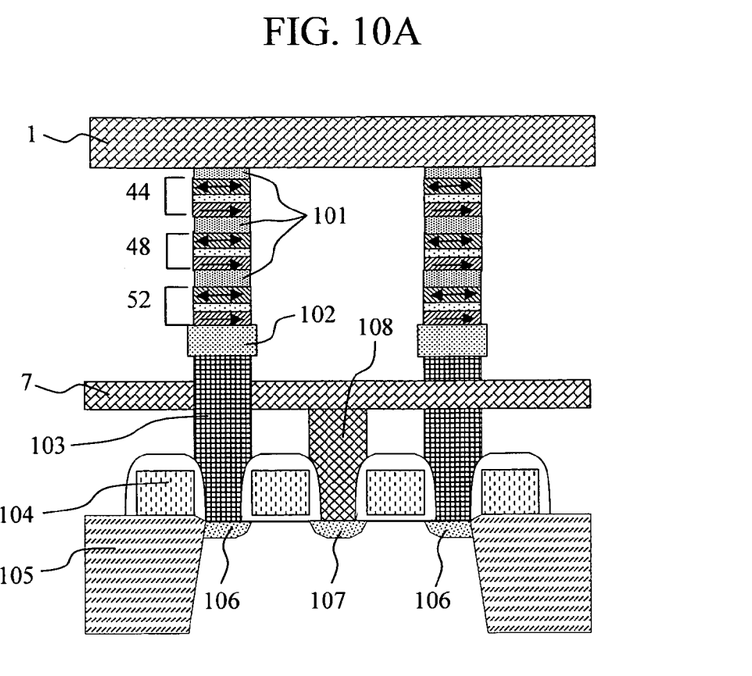
FIG. 10 is a view illustrating a specific structure of a memory cell.
Figure 10B:
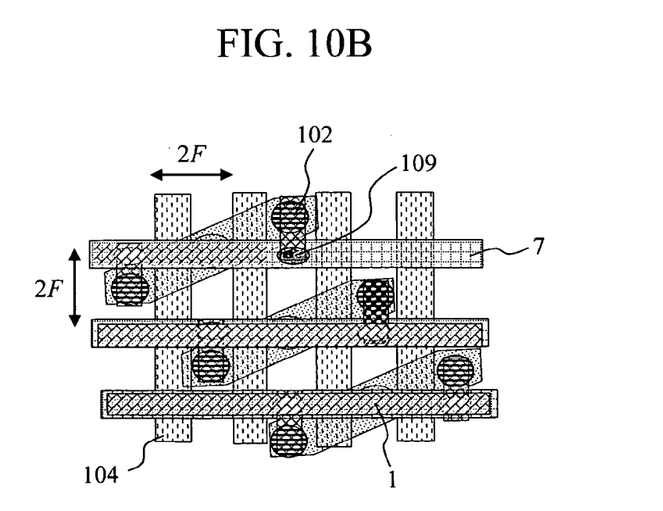

A specific explanation will be next given of a memory cell structure of the present invention using FIGS. 10A and B. FIG. 10A is a cross-sectional view of the memory cell, and FIG. 10B is a plane view of the memory cell. First, a transistor is formed at a lowermost part of the memory. The transistor controls a current to be made to flow into the magnetoresistance effect elements. Reference numeral 105 is a separation section; 106 and 107 are a drain region and a source region, respectively, of the transistor. The source region 107 is connected to the source line 7 through a metal via 108. Reference numeral 104 is a word line for applying electric field to the transistor. On the other hand, the drain region 106 is connected to a metal 102 to be a base for manufacturing magnetoresistance effect elements through a metal via 103. Three magnetoresistance effect elements are formed on the metal 102 while interposing a metal intermediate film 101 between each set of the elements to connect them to one another. The metal intermediate film 101 is, for example, a low resistive metal film such as Cu, Ru or the like. The magnetoresistance effect elements on the uppermost part are connected to the bit line 1 through the metal intermediate film 101. As is understood from the layout shown in FIG. 10B, an area occupied by unit cells of the memory array is a high integration of 2 F×4 F=8 F².

Explanation of Reference Numerals

1 . . . bit line, 2 . . . first ferromagnetic layer (free layer), 3 . . . intermediate layer, 4 . . . second ferromagnetic layer (fixed layer), 5 . . . gate electrode, 6 . . . transistor, 7 . . . source line, 31 . . . bias T, 41 . . . second ferromagnetic layer (free layer), 42 . . . non-magnetic intermediate layer, 43 . . . first ferromagnetic film (fixed layer), 44 . . . first magnetoresistance effect element, 45 . . . second ferromagnetic layer (free layer), 46 . . . non-magnetic intermediate layer, 47 . . . first ferromagnetic layer (fixed layer), 48 . . . second (central) magnetoresistance effect element, 49 . . . second ferromagnetic layer (free layer), 50 . . . non-magnetic intermediate layer, 51 . . . first ferromagnetic film (fixed layer), 52 . . . third magnetoresistance effect element, 101 . . . metal intermediate layer, 102 . . . base metal, 103 . . . metal via, 104 . . . word line, 105 . . . separation section, 106 . . . drain region, 107 . . . source region, and 108 . . . metal via

What is claimed is:

1. A magnetic memory which includes a magnetic memory element having a fixed layer and a free layer laminated with a non-magnetic layer interposed therebetween, and which performs recording based on a magnetization direction of the free layer with respect to a magnetization direction of the fixed layer, the magnetic memory comprising:

a first auxiliary element having a fixed layer and a free layer laminated with a non-magnetic layer interposed therebetween, the fixed layer and the free layer having magnetization directions that are antiparallel to each other;

a second auxiliary element having a fixed layer and a free layer laminated with a non-magnetic layer interposed therebetween, the fixed layer and the free layer having magnetization directions that are parallel to each other;

a means for making current to vertically flow into a film surface of the magnetic memory element through the first auxiliary element; and a means for making current to vertically flow into a film surface of the magnetic memory element through the second auxiliary element, wherein an absolute value of current necessary for changing the magnetization direction of the free layer of the magnetic memory element from an antiparallel state to a parallel state with respect to the magnetization direction of the fixed layer of the magnetic memory element is smaller than an absolute value of current necessary for changing the magnetization direction of the free layer of the first auxiliary element to the parallel state with respect to the magnetization direction of the fixed layer of the first auxiliary element, and an absolute value of current necessary for changing the magnetization direction of the free layer of the magnetic memory element from the parallel state to the antiparallel state with respect to the magnetization direction of the fixed layer of the magnetic memory element is smaller than an absolute value of current necessary for changing the magnetization direction of the free layer of the second auxiliary element to the antiparallel state with respect to the magnetization direction of the fixed layer of the second auxiliary element.

2. The magnetic memory according to claim 1, wherein the first auxiliary element and the second auxiliary element are connected to each other in series with the magnetic memory element interposed therebetween.

3. The magnetic memory according to claim 2, wherein Idc11>Idc21>Idc31, and
Idc12<Idc22<Idc32 where:
Idc11 represents an absolute value of current by which the magnetization directions of the fixed layer and the free layer of the first auxiliary element are changed from the antiparallel state to the parallel state;
Idc12 represents an absolute value of current by which the magnetization directions of the fixed layer and the free layer of the first auxiliary element are changed from the parallel state to the antiparallel state;
Idc21 represents an absolute value of current by which the magnetization directions of the fixed layer and the free layer of the magnetic memory are changed from the antiparallel state to the parallel state;
Idc22 represents an absolute value of current by which the magnetization directions of the fixed layer and the free layer of the magnetic memory are changed from the parallel state to the antiparallel state;
Idc31 represents an absolute value of current by which the magnetization directions of the fixed layer and the free layer of the second auxiliary element are changed from the antiparallel state to the parallel state; and
Idc32 represents an absolute value of current by which the magnetization directions of the fixed layer and the free layer of the second auxiliary element are changed from the parallel state to the antiparallel state.

4. The magnetic memory according to claim 2, wherein all of the first auxiliary element, the magnetic memory element and the second auxiliary element are tunnel magnetoresistance effect elements.

5. The magnetic memory according to claim 2, wherein the magnetic memory element is a tunnel magnetoresistance effect element, and the first and second auxiliary elements are giant magnetoresistance effect elements.

6. A magnetic memory which includes a magnetic memory element having a fixed layer and a free layer laminated with a non-magnetic layer interposed therebetween, and which performs recording based on a magnetization direction of the free layer with respect to a magnetization direction of the fixed layer, the magnetic memory comprising:
a first auxiliary element that generates high-frequency oscillation;
a means for making a direct-current pulse current to flow into a film surface of the magnetic memory element vertically in a direction from the free layer to the fixed layer, the direct-current pulse current being superimposed by a high-frequency current generated by the first auxiliary element;
a second auxiliary element that generates high-frequency oscillation; and
a means for making a direct-current pulse current to flow into a film surface of the magnetic memory element vertically in a direction from the fixed layer to the free layer, the direct-current pulse current being superimposed by a high-frequency current generated by the second auxiliary element.

7. The magnetic memory according to claim 6, wherein the first auxiliary element and the second auxiliary element are connected to each other in series with the magnetic memory element interposed therebetween.

8. The magnetic memory according to claim 7, wherein the magnetic memory element is a tunnel magnetoresistance effect element.

9. A method for writing to a magnetic memory that includes: a magnetic memory element having a fixed layer and a free layer laminated with a non-magnetic layer interposed therebetween; a first auxiliary element having a fixed layer and a free layer laminated with a non-magnetic layer interposed therebetween, the fixed layer and the free layer having magnetization directions that are antiparallel to each other; and a second auxiliary element having a fixed layer and a free layer laminated with a non-magnetic layer interposed therebetween, the fixed layer and the free layer having magnetization directions that are parallel to each other, the first auxiliary element and the second auxiliary element being connected to each other in series with the magnetic memory element interposed therebetween, in which
an absolute value of current necessary for changing a magnetization direction of the free layer of the magnetic memory element from an antiparallel state to a parallel state with respect to a magnetization direction of the fixed layer of the magnetic memory element is smaller than an absolute value of current necessary for changing the magnetization direction of the free layer of the first auxiliary element to the parallel state with respect to the magnetization direction of the fixed layer of the first auxiliary element,
an absolute value of current necessary for changing the magnetization direction of the free layer of the magnetic memory element from the parallel state to the antiparallel state with respect to the magnetization direction of the fixed layer of the magnetic memory element is smaller than an absolute value of current necessary for changing the magnetization direction of the free layer of the second auxiliary element to the antiparallel state with respect to the magnetization direction of the fixed layer of the second auxiliary element, and
recording is performed based on the magnetization direction of the free layer of the magnetic memory element with respect to the magnetization direction of the fixed layer of the magnetic memory element,
the method comprising the steps of:
applying a current pulse, having an absolute value smaller than that of current necessary for reversing the magnetization direction of the free layer of the magnetic memory element, in a direction from the first auxiliary element to the magnetic memory element when the magnetization direction of the free layer of the magnetic memory element is to be changed from the antiparallel state to the parallel state with respect to the magnetization direction of the fixed layer of the magnetic memory element; and applying a current pulse, having an absolute value smaller than that of current necessary for reversing the magnetization direction of the free layer of the magnetic memory element, in a direction from the second auxiliary element to the magnetic memory element when the magnetization direction of the free layer of the magnetic memory element is to be changed from the parallel state to the antiparallel state with respect to the magnetization direction of the fixed layer of the magnetic memory element.

* * * * *